United States Patent [19]

Wei et al.

[11] Patent Number: 5,712,000
[45] Date of Patent: Jan. 27, 1998

[54] LARGE-SCALE, LOW PRESSURE PLASMA-ION DEPOSITION OF DIAMONDLIKE CARBON FILMS

[75] Inventors: Ronghua R. Wei, Calabasas; Jesse N. Matossian, Canoga Park, both of Calif.

[73] Assignee: Hughes Aircraft Company, Los Angeles, Calif.

[21] Appl. No.: 542,468

[22] Filed: Oct. 12, 1995

[51] Int. Cl.$^6$ ........................................ B05D 3/06
[52] U.S. Cl. .................... 427/573; 427/577; 427/122; 427/249
[58] Field of Search ........................ 204/173; 427/573, 427/574, 577, 122, 249

[56] References Cited

U.S. PATENT DOCUMENTS

| | | | |
|---|---|---|---|
| 4,504,519 | 3/1985 | Zelez | 204/173 |
| 4,661,409 | 4/1987 | Kieser et al. | 204/173 |
| 4,764,394 | 8/1988 | Conrad et al. | 427/38 |
| 5,112,458 | 5/1992 | Nakayama et al. | 204/173 |
| 5,401,543 | 3/1995 | O'Neil et al. | 427/580 |

FOREIGN PATENT DOCUMENTS

| | | |
|---|---|---|
| 0 330 524 | 8/1989 | European Pat. Off. |
| 40 02 681 A1 | 8/1990 | Germany |
| A 60-065796 | 4/1985 | Japan |
| 63-286576 | 11/1988 | Japan |
| 1-132779 | 5/1989 | Japan |
| A 06025856 | 2/1994 | Japan |
| A 06320636 | 11/1994 | Japan |

OTHER PUBLICATIONS

Swec, Diane M.; Mirtich, Michael J.; Banks, Bruce A. "Ion Beam and Plasma Methods of Producing Diamondlike Carbon Films" (1988) NASA Technical Memorandum 102301, pp. 1–16, no month available.

Wei, R.; Wilbur, P.J.; Kustas, F.M. "A Rolling Contact Fatigue Study of Hard Carbon Coated M-50 Steel" (Apr., 1992), Journal of Tribology, vol. 114, pp. 298–302.

Blau, P.J., Yust, C.S., Heatherly, L.J., and Clausing, R.E. "Morphological aspects of the friction of hot-filament-grown diamond thin films", (B..V. 1990) Elsevier Science Publishers, pp. 399–407, no month available.

Doty, F.P. and Jesser, W.A. "Investigation of the Role of Charged Species in Hot Filmanet Assisted CVD of Diamond" (vol. 20, No. 2, 1991) Journal of Electronic Materials, pp. 121–126, no month available.

Shimada, Yoshihito, Mutsukura, Nobuki and Machi, Yoshio "Synthesis of Diamond Using Fe Catalysts by RF Plasma Chemical Vapor Deposition Method" (vol. 31, 1992), Jpn. J. Appl. Phys., pp. 1958–1963, no month available.

Barbarossa, V., Martini, O., Mercuri, S., Tomaciello, R., and Galluzzi, F. "RF Plasma Deposition of a–C:H Films: Diagnostics and Modeling" (1991) Diamond and Diamond–Like Films and Coatings, pp. 307–312.

Setaka, Nobuo, "Critical Assessment of State-Of-The-Art of Growing Diamond" (1991) Diamond and Diamond–Like Films and Coatings, pp. 875–888, no month available.

Badzian, A.R., Bachmann, P.K., Hartnett, T., Badzian, T. and Messier R., "Diamond Thin Films Prepared By Plasma Chemical Vapor Deposition Processes" (Jun., 1987, vol. XV), E-MRS Meeting, Materials Research Laboratory, pp. 63–76, no month available.

(List continued on next page.)

*Primary Examiner*—Kathryn L. Gorgos
*Assistant Examiner*—Kishor Mayekar
*Attorney, Agent, or Firm*—V. D. Duraiswamy; W. K. Denson-Low

[57] ABSTRACT

Diamondlike carbon is deposited on a deposition substrate in a deposition apparatus that can be evacuated and backfilled with a carbonaceous gas. A plasma is generated in the gas by heating a filament within the chamber to produce electrons, and positively biasing the filament with respect to the deposition chamber wall to accelerate the electrons into the carbonaceous gas. The carbonaceous gas dissociates and ionizes in the resulting plasma to produce positively charged carbon ions. A deposition substrate within the chamber is negatively biased with respect to the deposition chamber wall, accelerating the carbon ions so that they are deposited onto the surface of the substrate.

26 Claims, 2 Drawing Sheets

OTHER PUBLICATIONS

Scharff, W., Hammer, K. Stenzel, O., Ullman, J., Vogel, M., Frauenheim, T., Eibisch, B., Roth, S., Schulze, S., and Muhling, I. "Preparation of Amorphous i–C Films By Ion–Assisted Methods" (1989) Thin Solid Films, pp. 157–169, no month available.

Eddy, C.R., Jr., Sartwell, B.D., and Youchison, D.L., "Diamond thin film growth on silicon at temperatures between 500 and 600°C using an electron cyclotron resonance microwave plasma source" (vol. 48, 1991) pp. 69–79, no month available.

Yves, Catherine "Preparation Techniques for Diamond–Like Carbon" (1991) Diamond and Diamond–Like Films and Coatings, Plenum Press, pp. 193–227, no month available.

Zhu, W., et al. "Nucleation and selected area deposition of diamond by biased hot filament chemical vapor deposition" ('1994) Department of Materials Science and Engineering, North Carolina State University, pp. 425–430, no month available.

Butter, R., et al. "In vitro studies of DLC coatings with silicon intermediate layer" (1995) Nos.5/6 Elsevier Science S.A., pp. 857–861, no month available.

Iyer, S., et al. "Buckling patterns in diamond–like carbon films" (1994) Nos. 1/2, Thin Solid Films, Elsevier Science S.A., pp. 94–100, no month available.

5,712,000

LARGE-SCALE, LOW PRESSURE PLASMA-ION DEPOSITION OF DIAMONDLIKE CARBON FILMS

BACKGROUND OF THE INVENTION

This invention relates to plasma-ion deposition of a film onto a substrate, and, more particularly, to the large-scale, low-pressure deposition of a diamondlike carbon film.

Diamondlike carbon, also sometimes known as DLC, is a solid containing carbon, or carbon and hydrogen and having an amorphous structure. DLC has a hardness and wear resistance approaching that of diamond. The hardness and wear resistance of DLC are superior to those of many commonly available wear-resistant coatings such as carbides and nitrides. The coefficient of friction of DLC is even lower than that of diamond and other common coatings. The dry coefficient of friction of DLC is comparable with that of many oil-lubricated materials. Because DLC is amorphous, it covers surfaces uniformly without the variations found in crystalline coatings. Due to this combination of properties, DLC coatings are used for a variety of wear-resistance and low-friction applications.

Diamondlike carbon is applied as a coating to surfaces to improve their properties. A number of application technologies are available, including ion beam and plasma-assisted deposition techniques. In the ion beam approach, a carbonaceous precursor is dissociated and ionized in a source, and the resulting ions are accelerated to impinge upon a deposition substrate. Ion beam deposition requires a line of sight from the source to the deposition substrate, and therefore deposition onto large-scale, irregular substrates requires extensive manipulation of the substrate to bring the ion beam to bear on the various regions of the substrate.

In the plasma-assisted deposition techniques, a plasma is formed and the carbonaceous precursor is injected into the plasma. The precursor dissociates, and the resulting carbon ions deposit upon the surface of the deposition substrate from the plasma. The various plasma deposition techniques differ in the approach by which the plasma is formed and in the method of applying a voltage to the deposition substrate. Conventional plasma-assisted techniques use radiofrequency energy, a microwave, electron-cyclotron resonance, or high-pressure DC power to form the plasma. These various techniques, while operable, suffer from a lack of controllability of ion energy and an inability to easily scale to large systems that are of interest to coat large articles such as automotive dies or large numbers of small articles at one time. The reason for the inability to scale the process is the difficulty in efficiently coupling radio frequency and microwave energy to large volumes.

There is a need for an improved approach for the large-scale deposition of diamondlike carbon onto single or multiple deposition substrates, in a highly controlled manner. The present invention fulfills this need, and further provides related advantages.

SUMMARY OF THE INVENTION

The present invention provides a method for large-scale deposition of diamondlike carbon onto deposition substrates, and coated substrates prepared by the method. The approach of the invention permits deposition substrates of large size and simple or complex shapes, or large numbers of smaller deposition substrates of simple or complex shapes, to be coated inexpensively with diamondlike carbon. The process is readily controllable, achieving good reproducibility. No sample manipulation is required to achieve deposition over the surface of the substrate, including deposition in recesses, holes, and other non-line-of-sight regions. Multiple plasma sources are not required to coat complexly shaped substrates or multiple substrates, but may be used in some cases.

In accordance with the invention, a method of depositing a diamondlike carbon film with a precisely controlled ion energy onto a deposition substrate uses a deposition apparatus comprising a deposition chamber having a deposition chamber wall, a vacuum pump controllably communicating with the deposition chamber, a source of a carbonaceous gas controllably communicating with the deposition chamber, means for generating a plasma in a gas contained within the deposition chamber, a deposition substrate support within the deposition chamber, and a bias voltage/current source controllably connected between the deposition substrate support and the wall of the deposition chamber. The method includes supporting a deposition substrate on the deposition substrate support, evacuating the deposition chamber, introducing a carbonaceous gas into the deposition chamber from the source of a carbonaceous gas to a partial pressure of from about 0.01 to about 10 millitorr, and depositing a diamondlike carbon film onto the substrate at a substrate temperature of no more than about 300° C. and preferably as low a temperature as possible. The use of the relatively low pressure minimizes charge exchange in the plasma, and consequent degradation of ion energy. The step of depositing includes the steps of generating a plasma in the carbonaceous gas within the deposition chamber, and negatively biasing the deposition substrate relative to the deposition chamber wall.

The apparatus of the invention includes a source of an enveloping plasma. The term "enveloping plasma" as used herein refers to a low-pressure plasma that surrounds the workpiece except for areas of the surface of the workpiece that are intentionally shielded from the plasma such as masked areas or areas contacting a workpiece support, and also has low charge exchange. An enveloping plasma, in which the workpiece is completely immersed, is to be distinguished from a regional plasma which may be produced, for example, at the site where an ion beam impinges upon a surface. Although both involve the production of a plasma, they present quite different problems because in the case of an enveloping plasma it is an objective to produce a plasma which completely surrounds the workpiece (except for masked or support areas, as noted above) and is uniform so as to uniformly treat the workpiece. As will be discussed subsequently, no such objective nor constraint exists in the case of a regional plasma.

The approach of the invention is distinct from that of prior plasma processing approaches in which an enveloping plasma is used to produce a uniform coating on a substrate. In the glow discharge technique, the pressure is high, in the range of 10 millitorr to several Torr. Plasma production arises from a voltage applied between the workpiece and the chamber. Controllability of the plasma ion energy is limited because of charge exchange. Because the substrate is the source of emitted electrons, when an electrically insulating DLC film is deposited, arcing frequently occurs with associated damage to the film and to the substrate, as well as termination of the deposition process. In the intensified glow discharge technique, a separate filament emitter is provided, but the chamber pressure is still high, about 15–250 millitorr, and charge exchange again limits ion energy and deposition efficiency. In plasma source processing the source of the plasma is remote, not local. Consequently, it is difficult to obtain a uniform plasma around the workpiece.

In the present approach, the means for generating a plasma preferably includes a filament with a filament current source connected across the filament for electron production, although other electron sources such as a hollow cathode can also be used. A discharge voltage source controllably biases the filament with respect to the wall of the deposition chamber. In operation, the filament is heated to a thermionic temperature to emit electrons. The chamber wall is the anode with respect to the cathodic filament, so that the emitted electrons are drawn into the chamber to energetically interact with the gas within the chamber to form the plasma. The carbonaceous gas dissociates and ionizes, producing carbon ions in the plasma. Hydrogen ions and other radicals may also be present resulting from the dissociation. The deposition substrate is biased negatively (either DC-continuously or pulsed) with respect to the wall of the deposition chamber and thence the plasma, so that the positive ions are directed from the plasma to the deposition substrate to deposit thereon.

The plasma formation and the deposition processes therefore operate independently of each other and are separately controllable. The voltage and the plasma density are selected to ensure that the ion sheath surrounding the deposition substrate is relatively thin. The pressure is simultaneously selected so that the charge-exchange within the sheath is minimal. Achieving satisfactory deposition with a thin ion sheath and low charge-exchange is desirable, as the thickness of this ion sheath determines the smallest dimension, such as a recess width, that can be deposited and the charge-exchange influences the ion energy. In the present case, the smallest dimension into which deposition can occur is on the order of ½ millimeter, which is far smaller than can be achieved in ion beam deposition.

The present invention provides an advance in the art of deposition of diamondlike carbon films. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
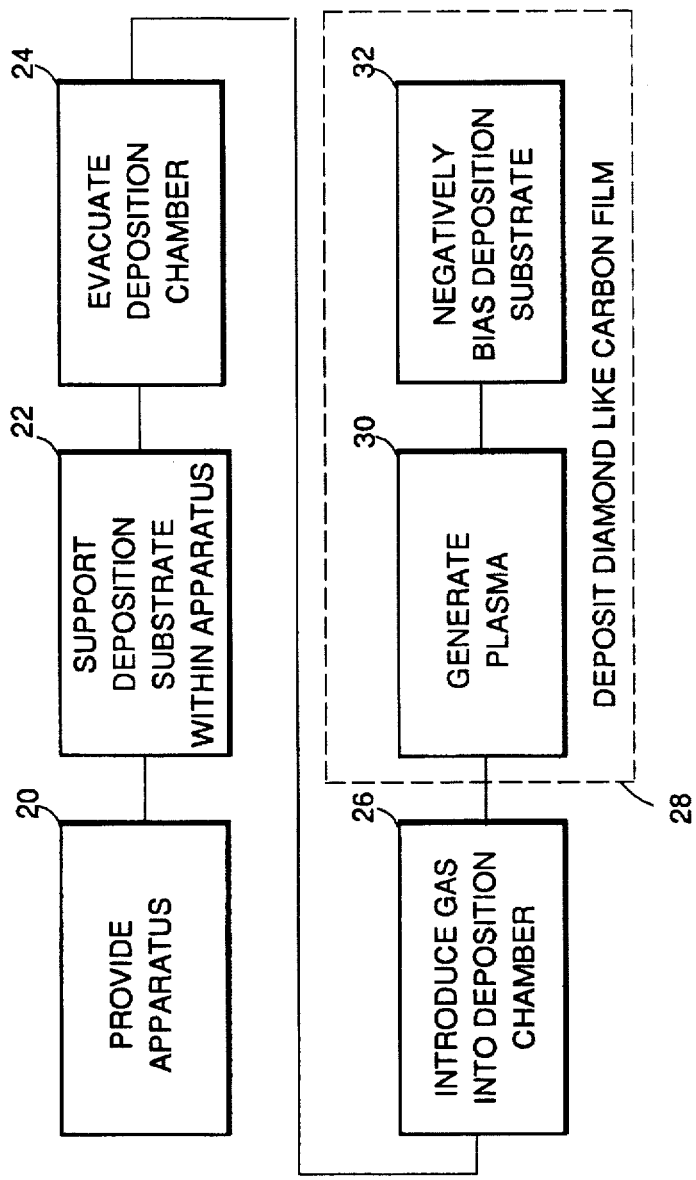
FIG. 1 is a block flow diagram for a method of depositing a diamondlike carbon film.
Figure 2:
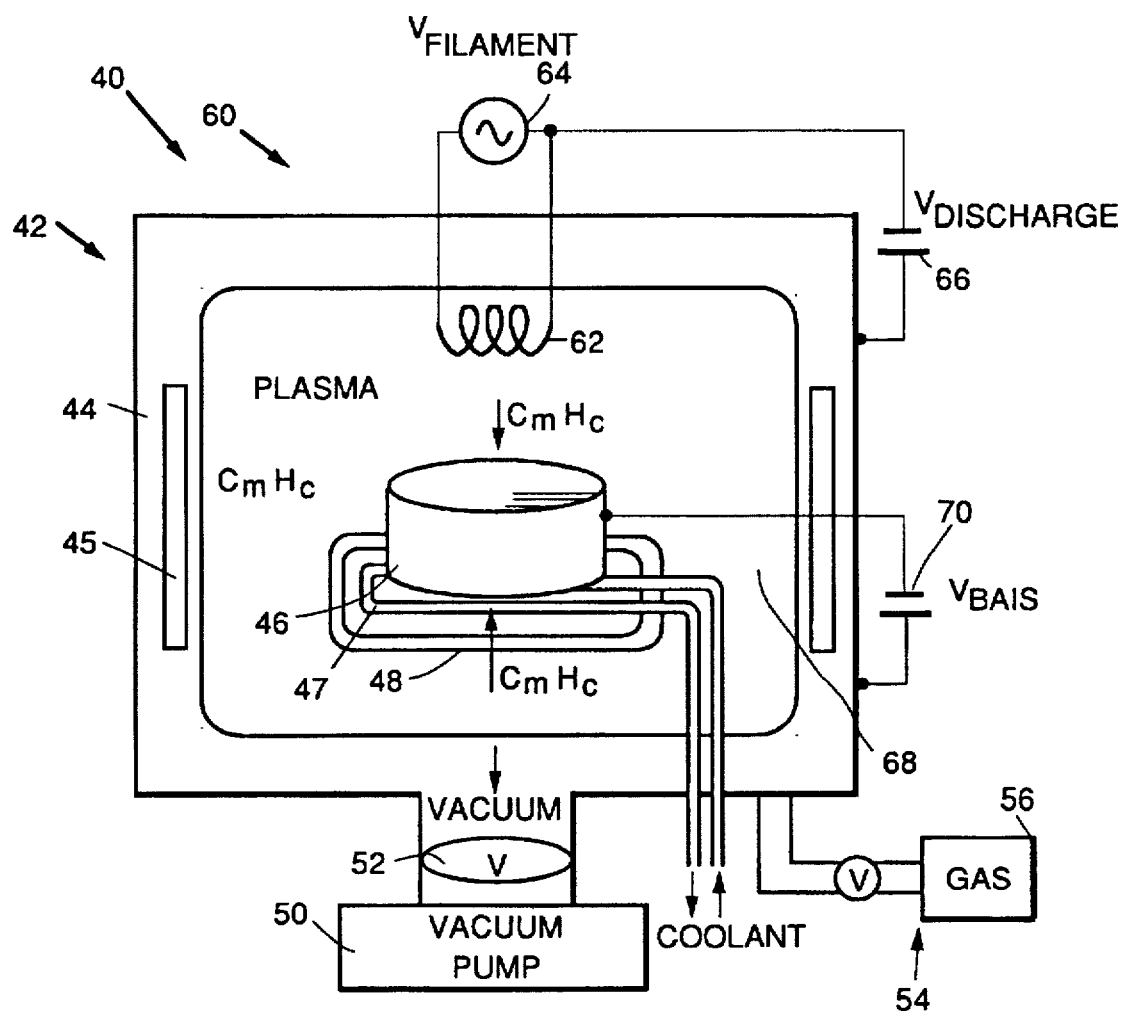
FIG. 2 is a schematic depiction of an apparatus according to the invention.

FIG. 1 is a block diagram illustrating the approach of the invention. A deposition apparatus is provided, numeral 20. A preferred deposition apparatus 40 is depicted in FIG. 2. The apparatus 40 includes a chamber 42 having a vacuum-tight chamber wall 44. The chamber 42 must be of a sufficiently large size to receive a deposition substrate 46 (or multiple substrates) therein. The deposition substrate may be made of any operable material, and some examples of interest include plain carbon steel, tool steel, stainless steel, aluminum alloys, and titanium alloys. The deposition substrate 46 is desirably supported on a support 48 that is electrically isolated from the chamber wall 44 (except for the application of a deposition substrate electrical bias, to be discussed subsequently). Optionally, there may be a temperature control means such as an auxiliary heater 45 or a cooling coil 47 to maintain the substrate 46 within the desired temperature range for deposition. The heater 45 can equivalently be a cooling panel or other device that acts to maintain the deposition substrate at a desired temperature. In most cases, however, no temperature control means is needed, and the substrate may be maintained within a desired temperature range for deposition by control of the plasma parameters.

The atmosphere within the chamber 42 is controlled by a combination of evacuation and backfilling. A vacuum pump 50 communicates with the interior of the chamber 42 through a controllable gate valve 52. The vacuum pump 50 preferably includes both a diffusion pump and a mechanical pump of sufficient size to achieve reasonably high vacuum, on the order of $10^{-6}$ Torr within the chamber 42, if desired. The vacuum level may, however, be controlled by operation of the gate valve 52, and in particular may be adjusted to a lesser vacuum if desired.

After evacuation, the chamber 42 is backfilled with a carbonaceous reactive gas from a gas source 54. The gas source includes a gas supply 56 communicating with the interior of the chamber 42 through a backfill valve 58. The gas source 54 supplies a reactive gaseous source of carbon; a silicon-containing gas or a mixture of a silicon-containing gas and hydrogen; a mixture of a silicon-containing gas, a carbon-containing gas, and hydrogen; any of these gases mixed with each other or with an inert gas; or an inert gas, from the gas supply 56. The reactive gaseous source of carbon can be any source which is operable to decompose to produce carbon ions and/or activated gaseous carbon, which can be deposited onto the deposition substrate 46. The preferred reactive gaseous sources of carbon are methane ($CH_4$), acetylene ($C_2H_2$), butene, and toluene.

The total gas pressure within the chamber 42 is controlled to be from about 0.01 to about 10 millitorr. A convenient way to accurately control the gas pressure is to open the gate valve 52 to permit the vacuum pump 50 to pump the chamber 42 to a slightly higher vacuum (i.e., low pressure) than desired. The backfill valve 58 is cracked open as necessary to permit gas from the supply 56 to flow into the chamber 42 to establish the desired total pressure. The vacuum within the chamber 42 is thus a continuously pumped dynamic vacuum that is effective to maintain the desired atmosphere in a steady state manner and to sweep away impurities such as might be driven out of the deposition substrate 46 or the chamber wall 44. Alternatively, but also within the scope of the invention, the chamber 42 may be statically pumped by first evacuating the chamber with the vacuum pump 50 and closing the gate valve 52. Gas is backfilled through the valve 58 until the desired pressure is reached, and the valve 58 is closed.

In operation, the deposition substrate 46 is supported within the chamber 42, preferably on the support 48, numeral 22. The chamber 42 is evacuated, numeral 24, and the required gaseous atmosphere is introduced, numeral 26. The atmosphere may be an inert atmosphere initially to permit sputter cleaning of the surface of the substrate, with the atmosphere thereafter changed to the carbonaceous source. Diamondlike carbon is deposited, numeral 28. During deposition, the temperature of the substrate is no greater than about 300° C. and most preferably is as low as possible. If the temperature is greater than about 300° C. a carbonaceous layer is formed on or just below the surface of the substrate, but the layer is not diamondlike carbon and is typically graphite.

To deposit the diamondlike carbon, a local plasma is produced within the chamber 42 by operating a local enveloping plasma source 60 within the chamber 42, numeral 30. As previously discussed, a local enveloping plasma source is distinct from a remote plasma source that may operate in another chamber, requiring a diffusion of the plasma into the processing chamber 42. It is also distinct from a regional plasma source that produces a plasma at a specific location on a surface where an ion or other beam is directed.

The plasma source 60 includes an electron emitter, preferably in the form of one or more filaments 62 located within the chamber 42 and most preferably adjacent to the chamber wall 44. More than one filament can be placed at various locations around the perimeter of the chamber 42 in order to adjust the shape and density of the resulting plasma to fully and uniformly envelop the deposition substrate(s) positioned within the chamber. The plasma is partially ionized, rather than weakly ionized or fully ionized. A "partially ionized" plasma is a plasma having an ion-to-atom ratio in the plasma of about 0.01–0.10. A weakly ionized plasma has an ion-to-atom ratio of less than about 0.01, while a fully ionized plasma has an ion-to-atom ratio of more than about 0.10.

An emitter current source 64 applies a voltage $V_{FILAMENT}$ across the filament 62, and thence supplies a current to the filament 62. The current flowing through the filament 62 heats the filament and causes the emission of electrons from the filament into the interior of the chamber 62. A filament bias voltage 66 that biases the filament 62 negatively with respect to the chamber wall 44, $V_{DISCHARGE}$, of typically about 30–150 volts, is applied between the filament 62 and the chamber wall 44.

Thermionic electrons emitted from the filament 62 are driven into the interior of the chamber 42 by the bias voltage 66. The electrons interact with the gas in the chamber 42 to create a plasma 68 which contains carbonaceous ions, radicals, and atomic and molecular hydrogen.

A deposition substrate bias voltage 70, $V_{BIAS}$, preferably of from 0 to about 3000 volts, is applied between the deposition substrate 46 (or the portion of the support 48 that is in electrical communication with the deposition substrate 46) and the chamber wall 44, numeral 32. The deposition substrate 46 is made negative or cathodic with respect to the chamber wall 44 by the voltage 70. The cathodic potential of the deposition substrate 46 accelerates carbon and hydrogen ions in the plasma 68 toward the deposition substrate 46 to deposit thereon. The bias voltage source 70 may be pulsed or DC-continuous.

Figure 3:
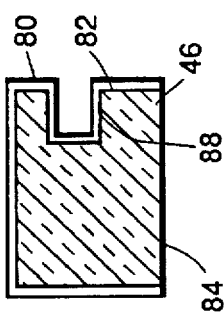
FIG. 3 is a schematic sectional view of a deposition substrate with a diamondlike carbon film coating thereon, prepared according to the approach of the invention.

A layer 80 of diamondlike carbon is deposited upon a surface 82 of the deposition substrate 46, as illustrated in FIG. 3. The diamondlike carbon can be nearly pure carbon, or it can be carbon with hydrogen dissolved therein. The composition of the coating can also include other elements that are present in the carbonaceous gas and released into the plasma when the gas decomposes. Dopant elements can be introduced as separate gases from the gas supply 56, if desired. All of these carbon-based compositions and composition variations are included within the term "diamondlike carbon", as used herein.

The layer 80 is deposited on all exposed surfaces 82 of the deposition substrate 46. In the illustration of FIG. 3, there is no deposition on a bottom surface 84, because that bottom surface 84 rested upon the substrate support 48 during deposition in the preferred approach. Regions of the surface may be intentionally masked to prevent deposition, if desired. However, deposition may be readily accomplished on all surfaces of the deposition substrate 46 by suspending the substrate from the support.

A feature of the present approach is that the layer 80 may be deposited into recesses such as the recess 88. Because the plasma envelops the deposition substrate, line of sight access from the source to the substrate is not required. The value of the bias voltage 70 and the plasma density allow the ion sheath surrounding the deposition substrate to be relatively thin. The dimension of the ion sheath determines the smallest recess into which deposition can occur, and in the case of the voltages typically used for the bias voltage 70, deposition can occur into recesses having a diameter as small as about ½ millimeter.

One of the problems commonly encountered in the deposition of diamondlike carbon layers onto some substrates, using prior processes, is achieving good adhesion between the DLC layer and the substrate. In many cases, particularly for metallic substrates, it is necessary to deposit a bonding layer onto the substrate prior to depositing the diamondlike carbon layer. In the present approach, two methods have been developed to increase the adhesion of the DLC film to the substrate.

In the first technique, the surface of the deposition substrate is first cleaned by sputter cleaning. Argon is supplied from the gas supply 56 to form the plasma. Argon ions impact the surface of the deposition substrate to clean it by sputtering and removing the near-surface region of the substrate. Other active gases such as hydrogen can also be used for the cleaning. After cleaning is complete, the cleaning gas is pumped out of the system, and the carbonaceous gas source is introduced. Deposition is conducted with a high energy of the carbonaceous ions, at a potential of about 1500–3000 volts and a low current density of less than about 0.1 milliamperes/cm$^2$, achieved by adjusting the bias voltage and the filament emission. A thin carbide layer, typically about 0.1 micrometers thick, slowly grows from the deposition substrate to serve as a transition layer. After the transition layer is formed, the deposition parameters are varied to reduce the ion energy to few hundred (typically less than about 600) volts and increase the current density to about 5 milliamperes/cm$^2$ or less. The higher current density results in more rapid deposition of the diamondlike carbon layer overlying the transition layer. The resulting diamondlike carbon layer adheres well to the deposition substrate. This approach has been demonstrated for aluminum, M-2 tool steel, and 304 stainless steel deposition substrates.

In the second technique, an amorphous hydrogenated silicon or hydrogenated silicon carbide bond layer is deposited prior to the deposition of the DLC fill, as discussed previously. The bond layer is applied in one embodiment by using a high concentration of silane ($SiH_4$) or other silicon containing gas, 100 percent to a few percent in a mixture with hydrogen or helium, for example. After argon sputter cleaning, the silane or its mixture is introduced into the chamber. By heating the filament and applying the discharge voltage, a plasma is formed. The plasma decomposes the silane and produces silicon ions and other radicals in the plasma in addition to hydrogen. A layer of hydrogenated silicon (a-Si:H) is deposited when a bias voltage is applied to the deposition substrate. If, in addition to the silane gas, a carbonaceous gas such as methane is added to the chamber during the bond layer deposition, a hydrogenated silicon carbide (a-Si$_x$C:H) bond layer is formed. Typical operational parameters for the deposition of the (a-Si:H) or the (a-Si$_x$C:H) bond layers are a pressure in the chamber of 0.5 millitorr, a discharge voltage of 50 volts, a bias voltage of 400 volts, and a current density of 0.1–3 milliamperes/cm$^2$.

The use of silane gas in high concentrations can raise safety concerns during handling and venting. Accordingly, an alternative approach is to use a low concentration of the silane, on the order of about 1.35 percent by volume, in a mixture with helium or hydrogen. Because of the low concentration of silicon in the mixture, a high pressure processing is preferred for a high deposition rate of the bond layer. A glow discharge technique can be used for this portion of the processing. As discussed before, if a carbonaceous gas is added to the chamber as well, amorphous a-Si$_x$C:H is obtained. Typical operational parameters are a gas pressure of 1.5 Torr (1.35 percent by volume silane in hydrogen), a negative bias voltage of 800 volts, and a current density of 1 milliampere/cm$^2$.

After the deposition of the bond layer of a-Si:H or a-Si$_x$C:H by any of these methods, the chamber is evacuated and methane or other operable carbonaceous gas source is introduced into the chamber for the DLC deposition as described previously.

The following examples are intended to illustrate aspects of the invention. However, they should not be interpreted as limiting the invention in any respect.

Example 1

A diamondlike carbon layer about 4 micrometers thick was deposited upon a flat piece of an aluminum-390 deposition substrate using the approach of FIG. 1 and the apparatus of FIG. 2. After loading the deposition substrate, the chamber 42 was pumped to a vacuum of 3×10$^{-6}$ Torr and backfilled with argon to a pressure of 5×10$^{-4}$ Torr. The deposition substrate was argon sputter cleaned for 20 minutes using a bias voltage 70 of 1100 volts and a current density of 0.3 milliamperes/cm$^2$. The argon flow was gradually turned off and a methane flow introduced into the chamber 42 to a pressure of 5×10$^{-4}$ Torr, while maintaining the plasma so that no contamination layer could reform on the deposition substrate. The bias voltage and current density were maintained at the same values as in the sputter cleaning for one hour, to deposit the transition layer having a thickness of about 0.1 micrometers. The voltage was thereafter reduced to 500 volts and the current density increased to 5 milliamperes per square centimeter for a period of one hour, to deposit a uniform film of the diamondlike carbon layer 80 having a thickness of about 4 micrometers.

Example 2

Example 1 was repeated, except that the deposition substrate was M-2 tool steel. The operating parameters and results were substantially the same.

Example 3

Example 1 was repeated, except that the deposition substrate was 304 stainless steel. The operating parameters and results were substantially the same.

Example 4

Example 1 was repeated, except that the deposition substrate was an automobile piston made of the Al-390 alloy. The operating parameters were substantially the same.

After depositing the diamondlike carbon layer, the piston was carefully inspected. The diamondlike carbon layer was about 4 micrometers thick. It was substantially uniform on both the outside and inside walls of the piston, and in the piston ring grooves on the outer diameter of the piston.

Example 5

Example 1 was repeated, except that a large deposition chamber 4 feet diameter by 8 feet long was used, and the substrates were 304 stainless steel, M-2 tool steel, and aluminum-390. Substantially the same results were obtained.

Example 6

A film of DLC about 2 micrometers thick was deposited on flat samples of 304 stainless steel after first depositing a layer of a-Si:H using the glow discharge method. After loading the substrates and pumping the chamber to about 0.02 millitorr, the samples were argon-sputter cleaned for 5 minutes at 450 volts and 0.5 milliamperes/cm$^2$ current density. A mixture of 1.35 percent by volume silane in hydrogen was introduced into the chamber to a pressure of 1.5–2 Torr. A bias voltage of 800 volts was applied to the substrates to generate a glow discharge at a current density of about 1 milliampere/cm$^2$. After 30 minutes of deposition of the a-Si:H onto the surface of the substrate, the gas flow was discontinued and the chamber was pumped out. Methane was fed into the chamber to a pressure of 0.5 millitorr. A discharge of 75 volts and 1 ampere current was produced using the filament, and a bias of 200 volts was applied to the parts at a current density of 0.7 milliamperes/cm$^2$. The resulting DLC fill was about 2 micrometers thick and the underlying a-Si:H silicon bond layer was 0.1–0.2 micrometers thick.

Example 7

Specimens of the deposition substrates prepared in Examples 1–3 and 6 were studied by Raman spectroscopy to verify the character of the diamondlike carbon layers. For comparison, a specimen of a diamondlike carbon layer deposited on 304 stainless steel by a commercial ion beam process was also analyzed. The coatings in the four cases were found to be substantially the same, verifying that the plasma-ion deposition process of the invention is successful in depositing an acceptable diamondlike carbon coating.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method of depositing a solid film containing carbon, or carbon and hydrogen, and having an amorphous structure onto a deposition substrate, comprising the steps of:

providing a deposition apparatus comprising
- a deposition chamber having a deposition chamber wall,
- a vacuum pump controllably communicating with the deposition chamber,
- a source of a carbonaceous gas controllably communicating with the deposition chamber, the carbonaceous gas being decomposable to produce carbon ions or activated gaseous carbon,
- means for generating a plasma in a gas contained within the deposition chamber,
- a deposition substrate support within the deposition chamber, and
- a bias voltage/current source controllably connected between the deposition substrate support and the wall of the deposition chamber;

providing a deposition substrate on the deposition substrate support;

evacuating the deposition chamber;

introducing a carbonaceous gas into the deposition chamber from the source of a carbonaceous gas, to a total gas pressure of from about 0.01 to about 10 millitorr; and depositing the film onto the substrate with the substrate at a temperature of no more than about 300° C. the step of depositing including the steps of generating a plasma in the carbonaceous gas within the deposition chamber, and negatively biasing the deposition substrate relative to the deposition chamber wall with the bias voltage/current source.

2. The method of claim 1, wherein the means for generating a plasma includes a filament, a filament current source controllably connected across the filament, and a discharge voltage source controllably connected between the filament and the deposition chamber wall.

3. The method of claim 2, wherein the step of generating a plasma includes the steps of passing a sufficient current through the filament with the current source to heat the filament to a thermionic temperature, and biasing the filament with respect to the deposition chamber wall with a voltage of from about 30 to about 150 volts.

4. The method of claim 1, wherein the step of negatively biasing includes the step of negatively biasing the deposition substrate relative to the deposition chamber wall with a voltage of from 0 to about 3000 volts.

5. The method of claim 1, including the additional step, after the step of supporting and before the step of evacuating, of preparing a surface of the deposition substrate for deposition of the film.

6. The method of claim 5, wherein the step of providing includes the steps of providing a source of an inert gas controllably communicating with the deposition chamber, and wherein the step of preparing includes the additional steps of introducing an inert gas into the deposition chamber from the source of an inert gas, generating a plasma in the inert gas within the deposition chamber, and negatively biasing the deposition substrate relative to the deposition chamber wall with the bias voltage source.

7. The method of claim 5, wherein the step of providing includes the steps of providing a source of a silicon-containing gas controllably communicating with the deposition chamber, and wherein the step of preparing includes the additional steps of introducing a silicon-containing gas into the deposition chamber from the source of the silicon-containing gas, generating a plasma in the silicon-containing gas within the deposition chamber, and negatively biasing the deposition substrate relative to the deposition chamber wall with the bias voltage source.

8. The method of claim 7, wherein the silicon-containing gas is a silane.

9. The method of claim 1, wherein the step of negatively biasing the deposition substrate includes the steps of initially biasing the deposition substrate with a first voltage applied at a first current for a first period of time, and thereafter biasing the deposition substrate with a second voltage applied at a second current for a second period of time, wherein the first voltage is greater than the second voltage and the first current is lower than the second current.

10. The method of claim 1, wherein the step of introducing a carbonaceous gas includes the step of introducing a mixture of a carbonaceous gas and a second gas.

11. The method of claim 1, wherein the step of introducing a carbonaceous gas includes the step of introducing a carbonaceous gas selected from the group consisting of methane, acetylene, butene, and toluene.

12. The method of claim 1, wherein the step of supporting a deposition substrate includes the step of providing a deposition substrate made of a material selected from the group consisting of aluminum, a titanium alloy, a plain carbon steel, a tool steel, and stainless steel.

13. The method of claim 1, wherein the step of negatively biasing includes the step of negatively biasing the deposition substrate relative to the deposition chamber wall with a DC-continuous bais voltage/current source.

14. The method of claim 1, wherein the step of negatively biasing includes the step of negatively biasing the deposition substrate relative to the deposition chamber wall with a pulsing bias voltage/current source.

15. The method of claim 1, wherein the step of generating a plasma includes the step of generating a plasma that envelops the deposition substrate, except for any masked or support areas of the deposition substrate.

16. The method of claim 1, wherein the carbonaceous gas has a partial pressure of from about 0.01 to about 10 millitorr.

17. The method of claim 1, wherein the plasma in the carbonaceous gas of partially ionized, with an ion-to-atom ratio of about 0.01–0.10.

18. A method of depositing a solid film containing carbon, or carbon and hydrogen, and having an amorphous structure onto a deposition substrate, comprising the steps of:

providing a deposition apparatus comprising a deposition chamber having a deposition chamber wall, a vacuum pump controllably communicating with the deposition chamber, a source of a carbonaceous gas controllably communicating with the deposition chamber, the carbonaceous gas being decomposable to produce carbon ions or activated gaseous carbon, means for generating a plasma in a gas contained within the deposition chamber, the means for generating a plasma including a filament, a filament current source controllably connected across the filament, and a discharge voltage source controllably connected between the filament and the deposition chamber wall, a deposition substrate support within the deposition chamber, and a bias voltage/current source controllably connected between the deposition substrate support and the wall of the deposition chamber;

providing a deposition substrate on the deposition substrate support;

evacuating the deposition chamber;

introducing a carbonaceous gas into the deposition chamber from the source of a carbonaceous gas, a partial pressure of the carbonaceous gas within the deposition chamber being from about 0.01 to about 10 millitorr; and depositing the film onto the substrate at a temperature of no more than about 300° C. the step of depositing including the steps of generating a plasma in the carbonaceous gas within the deposition chamber, the step of generating a plasma including the steps of passing a sufficient current through the filament with the current source to heat the filament to a thermionic temperature, and negatively biasing the filament with respect to the deposition chamber wall with a voltage of from about 30 to about 150 volts, and negatively biasing the deposition substrate relative to the deposition chamber wall with the bias voltage/current source at a voltage of from 0 to about 3000 volts.

19. The method of claim 18, including the additional step, after the step of supporting and before the step of evacuating, of preparing the surface of the deposition substrate for deposition of the film.

20. The method of claim 18, wherein the step of providing includes the steps of providing a source of an inert gas controllably communicating with the deposition chamber, and wherein the step of preparing includes the additional steps of introducing an inert gas into the deposition chamber from the source of an inert gas, generating a plasma in the inert gas within the deposition chamber, and negatively biasing the deposition substrate relative to the deposition chamber wall with the bias voltage source.

21. The method of claim 18, wherein the step of providing includes the steps of providing a source of a silicon-containing gas controllably communicating with the deposition chamber, and wherein the step of preparing includes the additional steps of introducing a silicon-containing gas into the deposition chamber from the source of the silicon-containing gas, generating a plasma in the silicon-containing gas within the deposition chamber, and negatively biasing the deposition substrate relative to the deposition chamber wall with the bias voltage source.

22. The method of claim 21, wherein the silicon-containing gas is a silane.

23. The method of claim 18, wherein the step of generating a plasma includes the step of generating a plasma that envelops the deposition substrate, except for any masked or support areas of the deposition substrate.

24. The method of claim 18, wherein the plasma in the carbonaceous gas of partially ionized, with an ion-to-atom ratio of about 0.01–0.10.

25. A method of depositing solid film containing carbon, or carbon hydrogen, and having an amorphous structure onto a deposition substrate, comprising the steps of:

providing a deposition substrate;

producing a plasma in a carbonaceous gas having a pressure of from about 0.01 to about 10 millitorr contacting the deposition substrate, the plasma enveloping the deposition substrate, except for any masked or support areas of the deposition substrate; and depositing the film onto the substrate from the plasma with the substrate at a temperature of no more than about 300° C.

26. The method of claim 25, wherein the plasma in the carbonaceous gas is partially ionized, with an ion-to-atom ratio of about 0.01–0.10.

* * * * *